United States Patent
Wu et al.

(10) Patent No.: US 11,343,928 B2
(45) Date of Patent: May 24, 2022

(54) AUTO-LOCK STRUCTURE FOR RISER

(71) Applicant: DELL PRODUCTS L.P., Round Rock, TX (US)

(72) Inventors: Hung-Wen Wu, New Taipei (TW); Kuang Hsi Lin, TaouYuan County (TW)

(73) Assignee: DELL PRODUCTS L.P., Round Rock, TX (US)

( * ) Notice: Subject to any disclaimer, the term of this patent is extended or adjusted under 35 U.S.C. 154(b) by 376 days.

(21) Appl. No.: 16/531,429

(22) Filed: Aug. 5, 2019

(65) Prior Publication Data
US 2021/0045259 A1 Feb. 11, 2021

(51) Int. Cl.
| H05K 5/02 | (2006.01) |
| E05B 55/12 | (2006.01) |
| E05B 47/00 | (2006.01) |
| E05B 15/10 | (2006.01) |
| H01F 7/02 | (2006.01) |

(52) U.S. Cl.
CPC ......... H05K 5/0221 (2013.01); E05B 15/101 (2013.01); E05B 47/004 (2013.01); E05B 55/12 (2013.01); H01F 7/02 (2013.01)

(58) Field of Classification Search
CPC ...... E05B 55/12; E05B 47/004; E05B 15/101; H05K 5/0221
See application file for complete search history.

(56) References Cited

U.S. PATENT DOCUMENTS

2014/0232303 A1* 8/2014 Simofi-Ilyes ............ H02K 7/10
318/372

FOREIGN PATENT DOCUMENTS

| CN | 102512114 B | 6/2012 | |
| CN | 205100733 U | 3/2016 | |
| CN | 105571854 B | 5/2016 | |
| CN | 205363104 U | 7/2016 | |
| CN | 205483595 U | 8/2016 | |
| CN | 205487848 U | 8/2016 | |
| CN | 206636373 U | 11/2017 | |
| CN | 107814139 A | 3/2018 | |
| CN | 107953961 A | 4/2018 | |
| CN | 107965234 A | 4/2018 | |
| WO | WO 92/03631 | * 3/1992 | ............ E05B 55/00 |

\* cited by examiner

*Primary Examiner* — Hung V Ngo
(74) *Attorney, Agent, or Firm* — Jackson Walker LLP; Christopher J. Rourk

(57) ABSTRACT

A lock assembly is disclosed that includes a base formed from a magnetic flux conducting material, the base secure to a chassis. A pin slidably disposed in the base and configured to move from a first open position to a second closed position. A magnet, disposed on a surface of a riser and configured to create a force on the pin that causes the pin to move from the open position to the closed position when the riser is disposed with the chassis.

20 Claims, 5 Drawing Sheets

AUTO-LOCK STRUCTURE FOR RISER

TECHNICAL FIELD

The present disclosure relates generally to chassis assemblies, and more specifically to an auto-lock structure for a riser that is deployed within a chassis.

BACKGROUND OF THE INVENTION

Equipment chassis are used to hold components. In order to secure the components within the chassis, it is typically necessary to use complex structures that are not configured to be quickly released. Quick release structures, to the extent that they exist, typically require a substantial amount of space and do not have automated lock and release mechanisms.

SUMMARY OF THE INVENTION

A lock assembly comprising a base formed from a magnetic flux conducting material is disclosed, where the base is secured to a chassis. A pin is slidably disposed in the base and is configured to move from a first open position to a second closed position. A magnet is disposed on a surface of a riser and is configured to create a force on the pin that causes the pin to move from the open position to the closed position when the riser is disposed within the chassis.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Aspects of the disclosure can be better understood with reference to the following drawings. The components in the drawings may be to scale, but emphasis is placed upon clearly illustrating the principles of the present disclosure. Moreover, in the drawings, like reference numerals designate corresponding parts throughout the several views, and in which.

DETAILED DESCRIPTION OF THE INVENTION

Figure 1:
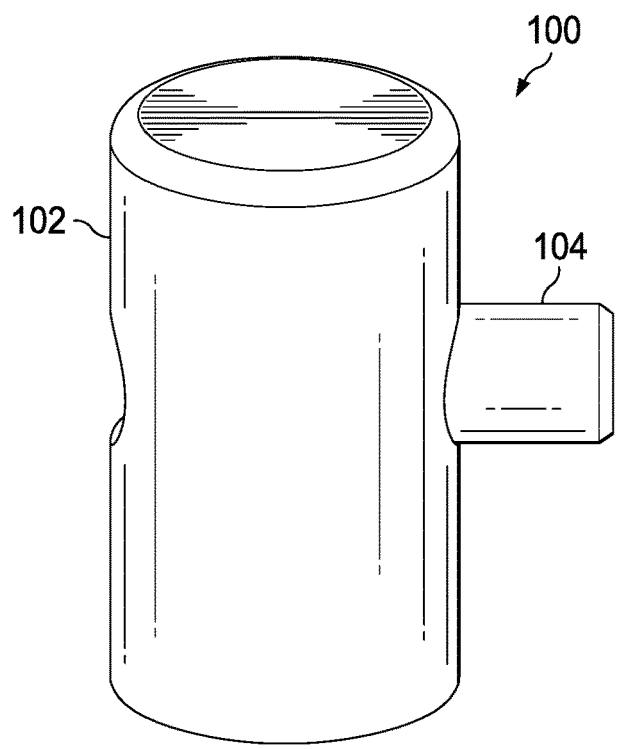
FIG. 1 is a diagram of an assembly for a riser lock, in accordance with an example of the present disclosure.

In the description that follows, like parts are marked throughout the specification and drawings with the same reference numerals. The drawing figures may be to scale and certain components can be shown in generalized or schematic form and identified by commercial designations in the interest of clarity and conciseness.

Existing riser lock designs fail to lock or un-lock the latch when the riser is assembled or removed. If a customer forgets to lock the riser latch, a connector connection problem can occur. Likewise, when the riser is extracted but is not unlocked, component damage can occur. While some retention solutions are available, they are large in size and block otherwise useful space, such as component board space, as well as service space that is required to install the larger support bracket. These existing retention solutions can cause high density motherboard layout impacts, can block cooling air flow, impact thermal loading and cause other problems.

The present disclosure provides a riser lock that can auto-lock when the riser is assembled, and unlock when the riser is removed, to help protect against negligent misoperation that can cause system function failure. In addition, the disclosed riser lock is substantially smaller than existing locks, and requires less space on the motherboard than existing tool-less solutions.

In one example embodiment, the riser lock module of the present disclosure includes a pin structure that can extend in response to a magnetic field generated by a magnet on a mating structure, which locks the riser to system. When the riser is to be removed, a magnet support bar can be rotated to cause the magnetic field lines to change so as to cause the pin to return to an unlocked position. The present disclosure is thus applicable to planar layouts that have high component densities, designs with CPU loads that consume wattage, and other configurations where the motherboard layout and thermal load require additional space.

FIG. 1 is a diagram of an assembly 100 for a riser lock, in accordance with an example of the present disclosure. Assembly 100 can be implemented in steel or other suitable magnetic materials.

Assembly 100 includes base 102 and pin 104. Base 102 is a cylindrical magnetic structure having a diameter and a height, with a top surface and a bottom structure that allows it to be secured to a motherboard or other chassis assembly. Pin 104 is disposed in a penetration through base 102, and can be a cylindrical magnetic structure or other suitable shapes that have a cross section that correspond to the shape of the penetration. Base 102 and pin 104 can include bezels or other suitable design features.

Figure 2:
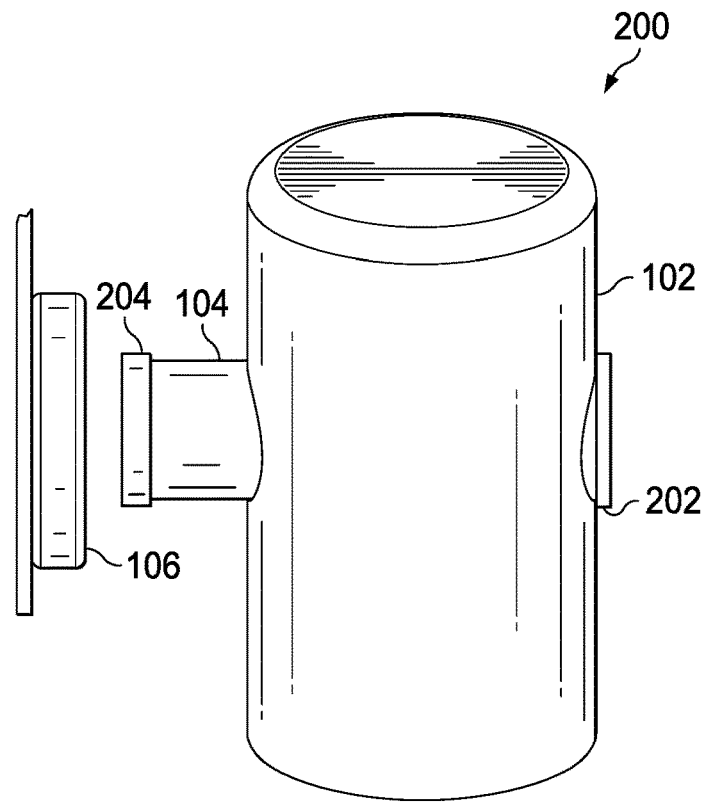
FIG. 2 is a diagram of an assembly for a riser lock and a magnetic actuator, in accordance with an example of the present disclosure.

FIG. 2 is a diagram of an assembly 200 for a riser lock and a magnetic actuator, in accordance with an example of the present disclosure. Assembly 200 can be implemented in steel or other suitable magnetic materials, and can include a permanent magnet, an electromagnet or other suitable magnets.

Assembly 200 includes base 102 and pin 104, which can further include stop assemblies 202 and 204. Stop assemblies 202 and 204 can be used to prevent pin 104 from being extracted from the penetration in base 102, and can be coupled to pin 102 by a mechanical mechanism such as screw threads or bolts, by soldering, by an adhesive or in other suitable manners. Pin 102 can also installed in the penetration in base 102 with a suitable lubricant, so as to prevent it from seizing within the penetration.

Assembly 200 also includes magnet 106, which can be a disc-shaped magnetic material disposed on a base or other suitable materials. In one example embodiment, magnet 106 can be a permanent magnet, an electromagnet or other suitable structures that generate magnetic flux and which creates a force on pin 104 so as to cause pin 104 to move to reduce the air gap between pin 104 and magnet 106. A magnetic material can be used to complete a magnetic flux path from magnet 106 to the bottom of base 102. In another example embodiment, stop assembly 204 can also or alternatively be formed from magnetic material or can otherwise be magnetized (such as using a wire coil).

In operation, when magnet 106 is placed in the vicinity of pin 104, magnetic flux generates a force that acts on pin 104 to cause pin to move in a direction that will minimize the air gap between pin 104 and magnet 106. Pin 104 can move within the penetration of base 102, and can be disposed adjacent to magnet 106 so as to allow pin 104 to contact magnet 106. The magnetic attraction between pin 104 and magnet 106 can provide a force that maintains an associated riser module in location, or that provides other suitable structural functions.

Figure 3:
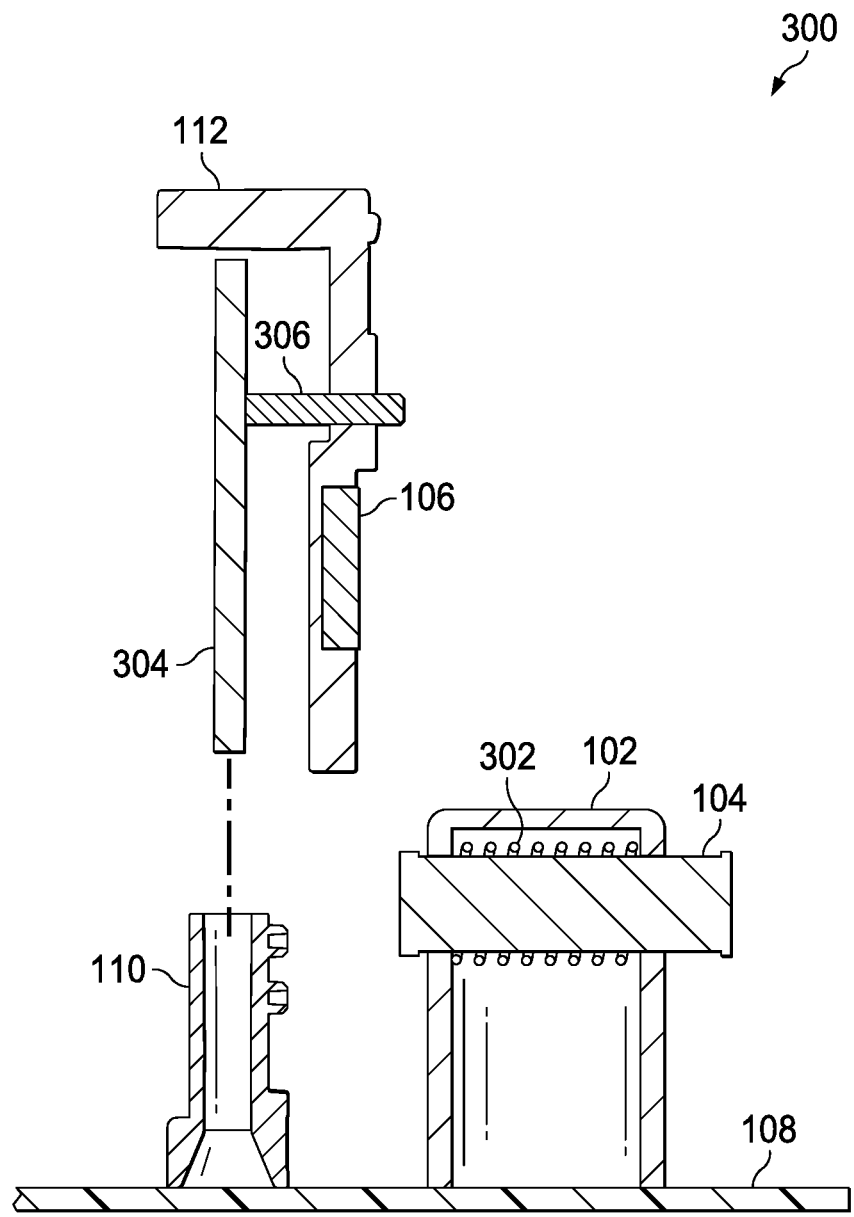
FIG. 3 is a diagram of an assembly for a riser lock with a spring, in accordance with an example of the present disclosure.

FIG. 3 is a diagram of an assembly 300 for a riser lock with a spring, in accordance with an example of the present disclosure. Assembly 300 can be implemented in steel or other suitable magnetic materials, and can include a permanent magnet, an electromagnet or other suitable magnets.

Assembly 300 includes vertical support 112, which holds magnet 106 and which further includes structural support 304. Base support 110 is configured to receive structural support 304 and to secure vertical support 112 to base 108. While vertical support 112, structural support 304 and base support 110 are each shown having specific configurations, those configurations can be varied as suitable as long a magnetic flux pathway exists to conduct magnetic flux from magnet 106 to pin 104. Vertical support 112 and structural support 304 can be provided as part of a riser that is secured to base 108 when structural support 304 is inserted or rotated on axle 306 into base support 110, which can cause magnet 106 to be placed close enough to pin 104 so as to cause pin 104 to move and to secure the riser to base 108.

Spring 302 can be disposed around pin 104 within base 102, and can provide a counter-force to the magnetic force generated by magnet 106. In one example embodiment, spring 302 can be secured to pin 104 by mechanical supports or in other suitable manners, so as to convey an opening force to pin 104 when magnet 106 is separated from pin 104.

In operation, assembly 300 allows a riser to be secured to a base with a magnetic locking structure. Assembly 300 thus provides additional securing and helps to reduce the inadvertent failure to secure a riser or other suitable equipment to a base.

Figure 4:
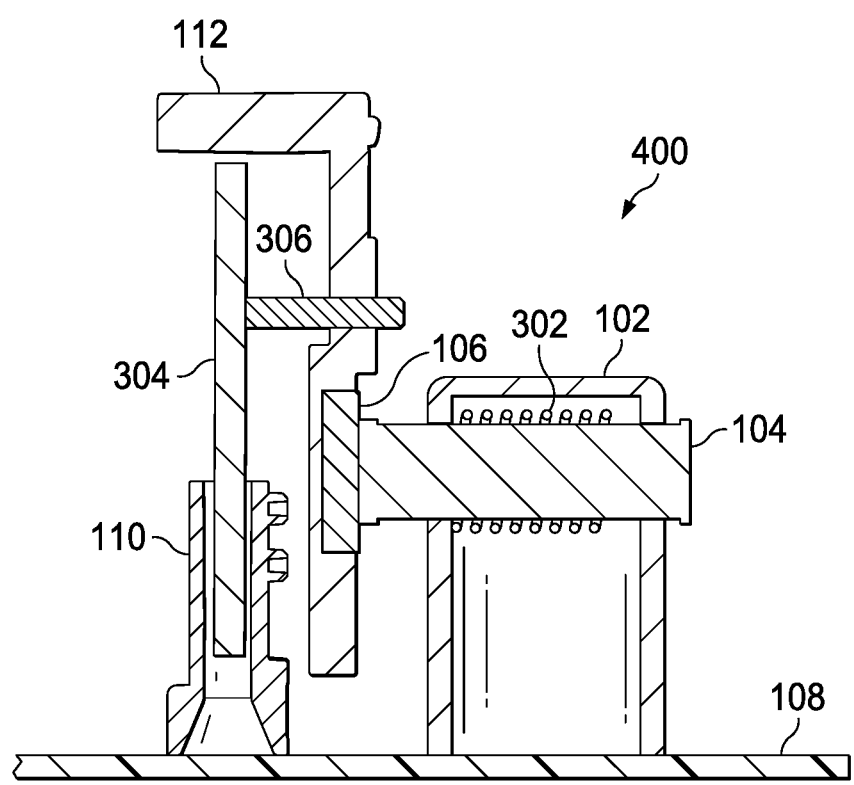
FIG. 4 is a diagram of an assembly for a riser lock in a locked and unlocked configuration, in accordance with an example of the present disclosure.

FIG. 4 is a diagram of an assembly 400 for a riser lock in a locked configuration, in accordance with an example of the present disclosure. Assembly 400 can be implemented in steel or other suitable magnetic materials, and can include a permanent magnet, an electromagnet or other suitable magnets.

Assembly 400 includes vertical support 112, which holds magnet 106 and which further includes structural support 304. Base support 110 is configured to receive structural support and to secure vertical support 112 to base 108. While vertical support 112, structural support 304 and base support 110 are each shown having specific configurations, those configurations can be varied as suitable as long a magnetic flux pathway exists to conduct magnetic flux from magnet 106 to pin 104. Vertical support 112 and structural support 304 can be provided as part of a riser that is secured to base 108 when structural support 304 is inserted or rotated on axle 306 into base support 110, as shown, which can cause magnet 106 to be placed close enough to pin 104 so as to cause pin 104 to move and to secure the riser to base 108.

Spring 302 can be disposed around pin 104 within base 102, and can provide a counter-force to the magnetic force generated by magnet 106. In one example embodiment, spring 302 can be secured to pin 104 by mechanical supports or in other suitable manners, so as to convey an opening force to pin 104 when magnet 106 is separated from pin 104.

In operation, assembly 400 allows a riser to be secured to a base with a magnetic locking structure. Assembly 400 thus provides additional securing and helps to reduce the inadvertent failure to secure a riser or other suitable equipment to a base.

Figure 5:
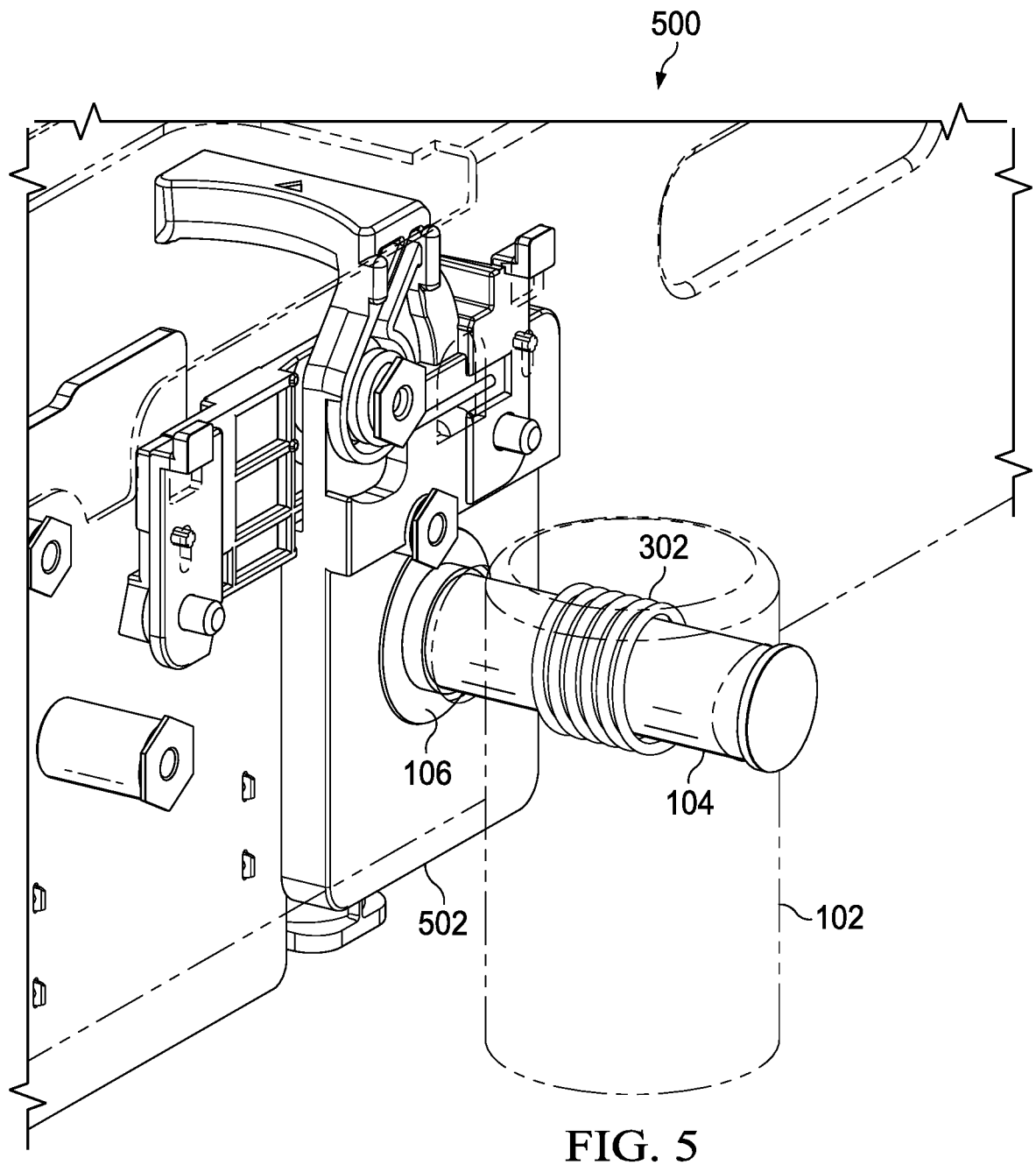
FIG. 5 is a diagram of an assembly for a riser lock in a locked configuration, in accordance with an example of the present disclosure.

FIG. 5 is a diagram of an assembly 500 for a riser lock in a locked configuration, in accordance with an example of the present disclosure. Assembly 500 provides an isometric view of pin 104 coupled to magnet 106, such as when latch 502 of a riser has been secured into position. Latch 502 can include vertical support 112 and/or structural support 304, and can be locked into base support 110 (not explicitly shown). In this manner, the riser can be secured within the chassis after latch 502 is deployed.

Figure 6:
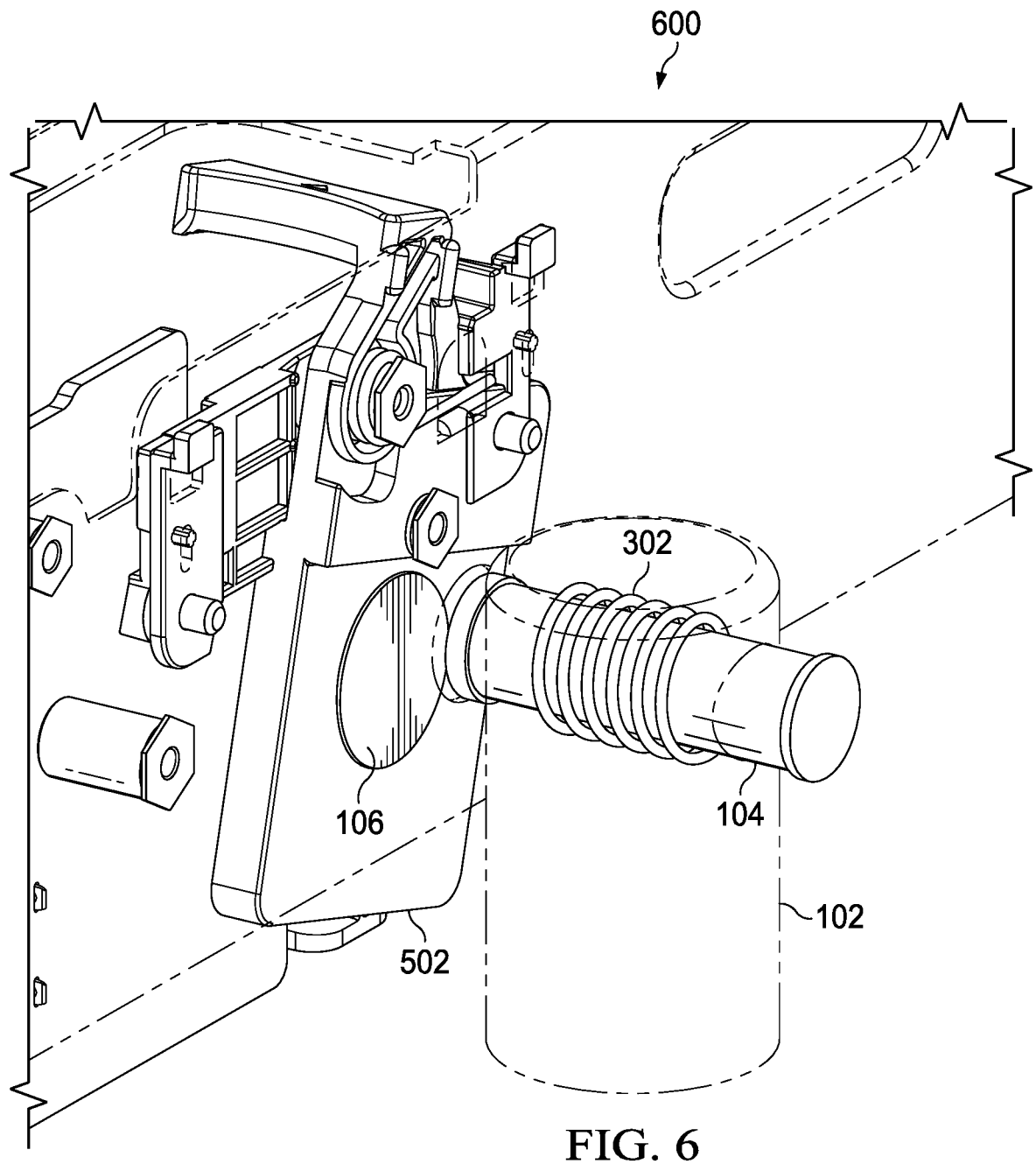
FIG. 6 is a diagram of an assembly for a riser lock in an unlocked configuration, in accordance with an example of the present disclosure.

FIG. 6 is a diagram of an assembly 600 for a riser lock in an unlocked configuration, in accordance with an example of the present disclosure. Assembly 600 provides an isometric view of pin 104 uncoupled from magnet 106, such as when latch 502 of a riser has been released from a lock position. Latch 502 can include vertical support 112 and/or structural support 304, and can be locked into base support 110 (not explicitly shown). In this manner, the riser can be released from the chassis after latch 502 is released.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

As used herein, "hardware" can include a combination of discrete components, an integrated circuit, an application-specific integrated circuit, a field programmable gate array, or other suitable hardware. As used herein, "software" can include one or more objects, agents, threads, lines of code, subroutines, separate software applications, two or more lines of code or other suitable software structures operating in two or more software applications, on one or more processors (where a processor includes one or more microcomputers or other suitable data processing units, memory devices, input-output devices, displays, data input devices such as a keyboard or a mouse, peripherals such as printers and speakers, associated drivers, control cards, power sources, network devices, docking station devices, or other suitable devices operating under control of software systems in conjunction with the processor or other devices), or other suitable software structures. In one exemplary embodiment, software can include one or more lines of code or other suitable software structures operating in a general purpose software application, such as an operating system, and one or more lines of code or other suitable software structures operating in a specific purpose software application. As used herein, the term "couple" and its cognate terms, such as "couples" and "coupled," can include a physical connection (such as a copper conductor), a virtual connection (such as through randomly assigned memory locations of a data memory device), a logical connection (such as through logical gates of a semiconducting device), other suitable connections, or a suitable combination of such connections. The term "data" can refer to a suitable structure for using, conveying or storing data, such as a data field, a data buffer, a data message having the data value and sender/receiver address data, a control message having the data value and one or more operators that cause the receiving system or component to perform a function using the data, or other suitable hardware or software components for the electronic processing of data.

In general, a software system is a system that operates on a processor to perform predetermined functions in response to predetermined data fields. A software system is typically created as an algorithmic source code by a human programmer, and the source code algorithm is then compiled into a machine language algorithm with the source code algorithm functions, and linked to the specific input/output devices, dynamic link libraries and other specific hardware and software components of a processor, which converts the processor from a general purpose processor into a specific purpose processor. This well-known process for implementing an algorithm using a processor should require no explanation for one of even rudimentary skill in the art. For example, a system can be defined by the function it performs and the data fields that it performs the function on. As used herein, a NAME system, where NAME is typically the name of the general function that is performed by the system, refers to a software system that is configured to operate on a processor and to perform the disclosed function on the disclosed data fields. A system can receive one or more data inputs, such as data fields, user-entered data, control data in response to a user prompt or other suitable data, and can determine an action to take based on an algorithm, such as to proceed to a next algorithmic step if data is received, to repeat a prompt if data is not received, to perform a mathematical operation on two data fields, to sort or display data fields or to perform other suitable well-known algorithmic functions. Unless a specific algorithm is disclosed, then any suitable algorithm that would be known to one of skill in the art for performing the function using the associated data fields is contemplated as falling within the scope of the disclosure. For example, a message system that generates a message that includes a sender address field, a recipient address field and a message field would encompass software operating on a processor that can obtain the sender address field, recipient address field and message field from a suitable system or device of the processor, such as a buffer device or buffer system, can assemble the sender address field, recipient address field and message field into a suitable electronic message format (such as an electronic mail message, a TCP/IP message or any other suitable message format that has a sender address field, a recipient address field and message field), and can transmit the electronic message using electronic messaging systems and devices of the processor over a communications medium, such as a network. One of ordinary skill in the art would be able to provide the specific coding for a specific application based on the foregoing disclosure, which is intended to set forth exemplary embodiments of the present disclosure, and not to provide a tutorial for someone having less than ordinary skill in the art, such as someone who is unfamiliar with programming or processors in a suitable programming language. A specific algorithm for performing a function can be provided in a flow chart form or in other suitable formats, where the data fields and associated functions can be set forth in an exemplary order of operations, where the order can be rearranged as suitable and is not intended to be limiting unless explicitly stated to be limiting.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:

1. A lock assembly comprising:
    a base formed from a magnetic flux conducting material, the base secured to a chassis base;
    a pin slidably disposed in the base and configured to move from a first open position to a second closed position; and
    a magnet, disposed on a surface of a riser and configured to create a force on the pin that causes the pin to move from the open position to the closed position when the riser is disposed on one side of the chassis base, wherein the surface of the riser further comprises a vertical support.

2. The lock assembly of claim 1, wherein the base further comprises a cylindrical structure.

3. The lock assembly of claim 1, wherein the base further comprises a cylindrical structure having a penetration, wherein the pin is disposed in the penetration.

4. The lock assembly of claim 1, wherein the base further comprises a cylindrical structure having a cylindrical penetration, wherein the pin comprises a cylindrical pin and is disposed in the penetration.

5. The lock assembly of claim 1, wherein the base further comprises a cylindrical structure having a penetration, wherein the pin is disposed in the penetration, and wherein a spring is disposed around the pin.

6. The lock assembly of claim 1, wherein the base further comprises a cylindrical structure having a penetration, wherein the pin is disposed in the penetration, and wherein a spring is disposed around the pin and secured to the pin so as to create an opening force on the pin when the pin is in the closed position.

7. The lock assembly of claim 1 wherein the surface of the riser further comprises a rotating latch structure.

8. The lock assembly of claim 1 wherein the surface of the riser further comprises a vertical support rotatably attached to a structural support.

9. The lock assembly of claim 1 wherein the surface of the riser further comprises a vertical support of a rotating latch that is rotatably attached to a structural support of the riser.

10. The lock assembly of claim 1 wherein the surface of the riser further comprises a structural support configured to be secured to a base support that is disposed on the chassis base.

11. A lock assembly comprising:
    a cylindrical base formed from a magnetic flux conducting material, the cylindrical base secured to a chassis base;
    a cylindrical pin slidably disposed in the cylindrical base and configured to move from a first open position to a second closed position; and
    a magnet, disposed on a moveable surface of a riser and configured to create a force on the cylindrical pin that causes the cylindrical pin to move from the open position to the closed position when the riser is disposed on one side of the chassis base, wherein the surface of the riser further comprises a rotating latch structure.

12. The lock assembly of claim 11, wherein the cylindrical base further comprises a cylindrical penetration, wherein the cylindrical pin is disposed in the cylindrical penetration.

13. The lock assembly of claim 11, wherein the cylindrical base further comprises a cylindrical penetration, wherein the cylindrical pin is disposed in the cylindrical penetration, and wherein a spring is disposed around the cylindrical pin.

14. The lock assembly of claim 11, wherein the cylindrical base further comprises a cylindrical penetration, wherein the cylindrical pin is disposed in the cylindrical penetration, and wherein a spring is disposed around the cylindrical pin and is secured to the cylindrical pin so as to create an opening force on the cylindrical pin when the cylindrical pin is in the closed position.

15. The lock assembly of claim 11 wherein the surface of the riser further comprises a vertical support.

16. The lock assembly of claim 11 wherein the surface of the riser further comprises a vertical support rotatably attached to a structural support.

17. The lock assembly of claim 11 wherein the surface of the riser further comprises a vertical support of a rotating latch that is rotatably attached to a structural support of the riser.

18. The lock assembly of claim 11 wherein the surface of the riser further comprises a structural support configured to be secured to a base support that is disposed on the chassis base.

19. A lock assembly comprising:
 a base formed from a magnetic flux conducting material, the base secured to a chassis base;
 a pin slidably disposed in the base and configured to move from a first open position to a second closed position; and
 a magnet, disposed on a surface of a riser and configured to create a force on the pin that causes the pin to move from the open position to the closed position when the riser is disposed on one side of the chassis base, wherein the surface of the riser further comprises a vertical support rotatably attached to a structural support.

20. The lock assembly of claim 19 wherein the vertical support is a vertical support of a rotating latch.

* * * * *